Figure 1:
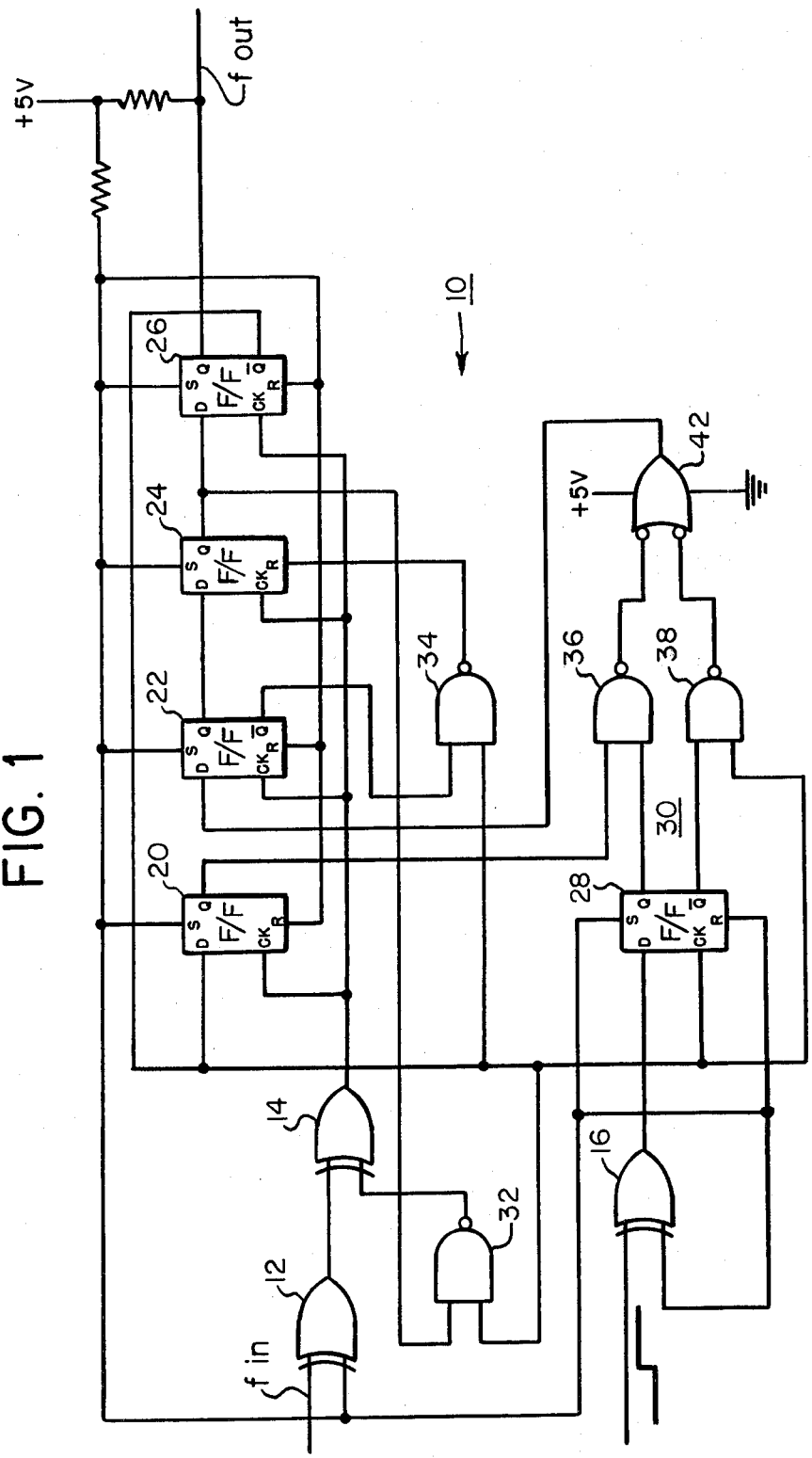
Figure 2:
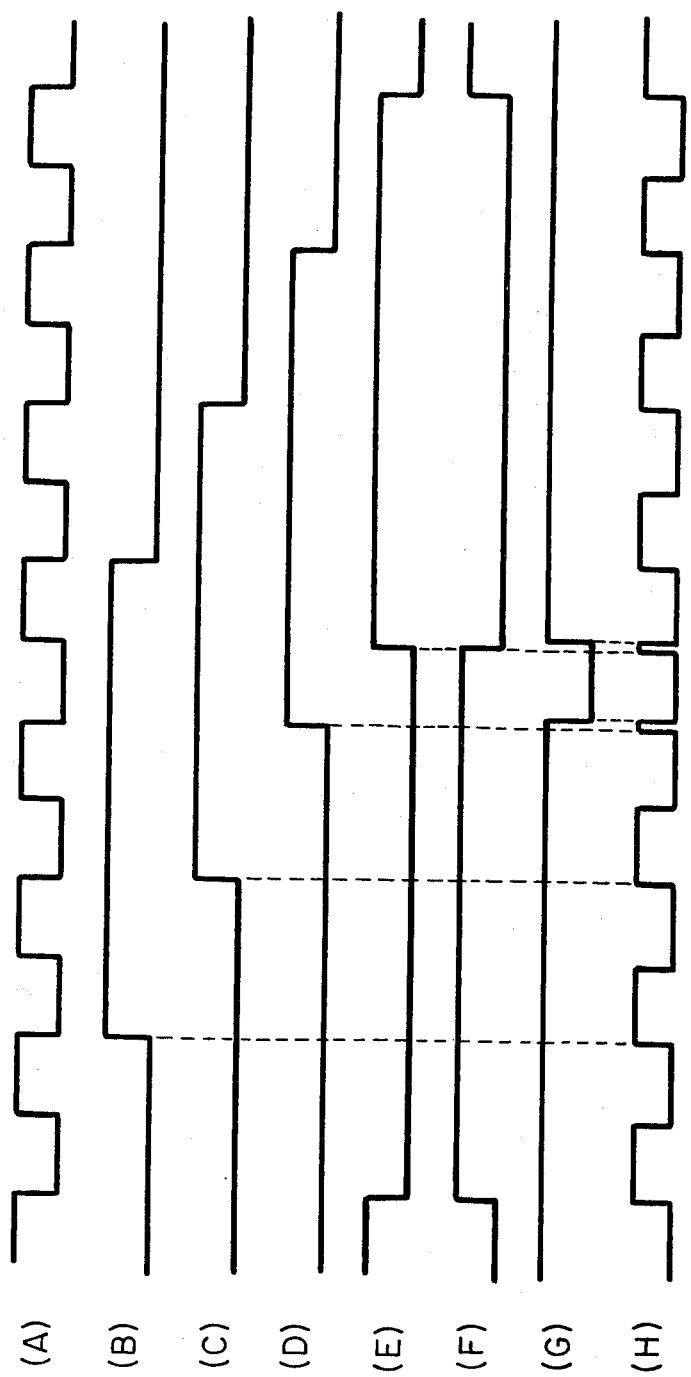

United States Patent [19]
Doron

[11] 4,406,014
[45] Sep. 20, 1983

[54] SWITCHED FREQUENCY DIVIDER

[75] Inventor: Joseph Doron, West Hartford, Conn.

[73] Assignee: Bristol Babcock Inc., Waterbury, Conn.

[21] Appl. No.: 250,860

[22] Filed: Apr. 3, 1981

[51] Int. Cl.³ .......................................... H03K 21/36
[52] U.S. Cl. .................................. 377/107; 377/111; 377/116
[58] Field of Search ........................... 328/46, 48, 41; 307/224 R; 377/107, 111, 116

[56] References Cited

U.S. PATENT DOCUMENTS

| | | | |
|---|---|---|---|
| 3,078,417 | 2/1963 | Nick | 307/224 R |
| 3,258,696 | 6/1966 | Heymann | 328/48 |
| 3,341,693 | 9/1967 | Hurst | 328/46 |
| 3,456,200 | 7/1969 | Bus | 307/224 R |
| 3,484,699 | 12/1969 | Israel | 328/46 |
| 3,530,284 | 9/1970 | Wood | 328/46 |
| 3,958,182 | 5/1976 | Sauthier | 328/48 |

*Primary Examiner*—John S. Heyman
*Attorney, Agent, or Firm*—Pennie & Edmonds

[57] ABSTRACT

A switched frequency divider is disclosed comprising an array of bistable devices which are linked together so as to propagate through the array a low or high signal applied to an input to the array, first gating means for inserting at least one more bistable device into the array, and second gating means for making such an insertion only when the output of the array completes a cycle. To provide for an output wave form that has approximately a 50 percent duty cycle, the bistable devices are coupled together in the form of a Johnson counter. To permit a change in the divisor only upon the completion of an output cycle, the second gating means is a bistable device which reads an incoming control signal only when the output of the Johnson counter makes a specified change in state. Advantageously, the switched frequency divider may be used as an FSK modulator to generate different AC frequencies from a single AC input signal in response to a digital data signal applied to the divider as said control signal.

7 Claims, 2 Drawing Figures

SWITCHED FREQUENCY DIVIDER

CROSS REFERENCE TO RELATED APPLICATION

A related application, incorporated herein by reference, is "Wide Band Modem For High Speed Data Transmission", filed concurrently herewith and assigned to Bristol Babcock Inc.

BACKGROUND OF THE INVENTION

This relates to a frequency divider and, more particularly, to one which can be switched so as to divide an input signal by one of a plurality of different values. The divider has the further advantage that its output signal has approximately a 50 percent duty cycle and that switching between one divisor and another takes place only upon completion of a division cycle.

As is well known, data is often transmitted over a communication line in the form of pulses of certain frequencies. In a communication system using frequency shift keying (FSK), one of two DC levels that represents digital data is converted by a modem to an AC signal having a first frequency; and the other level of the DC signal is converted to an AC signal having a second frequency. It is conventional in the art to refer to the lower of these DC levels and corresponding AC frequency as a SPACE or "0" and to the higher DC level and the corresponding AC frequency as a MARK or "1".

One method for obtaining the two frequency signals representative of MARK and SPACE is to divide down the output of a suitable oscillator by different amounts. For example, the output of a 17.5 MHz oscillator can be divided by 7 to produce a 1.5 MHz signal representative of a MARK; and it can be divided by 5 to produce a 3.5 MHz signal representative of a SPACE.

There are several constraints, however, on the use of such division techniques to generate the different frequency levels which might be used in data communication. First, to simplify post modulation filtering of the output signal it is desirable that the output of the frequency divider have approximately a 50 percent duty cycle in order to minimize any DC component in the output signal. Second, to eliminate telegraph switching distortions, it is desirable to permit changes in the magnitude of the frequency divisor only when the divisor has completed a division. Third, it is desirable to minimize the number of elements required to form the desired frequency divider.

SUMMARY OF THE INVENTION

I have devised a switched frequency divider which permits one to divide an input frequency by any one of at least two different dividers, which provides an output frequency which has approximately a 50 percent duty cycle and which permits a change of dividers only upon the completion of a division cycle. The switched frequency divider of my invention comprises an array of bistable devices which are linked together so as to propagate through the array a high (MARK) or low (SPACE) signal applied to an input to the array, first gating means for inserting at least one more bistable device into the array, and second gating means for making such an insertion only when the output of the array completes a cycle. To provide for an output wave form that has approximately a 50 percent duty cycle the bistable devices are coupled together in the form of a Johnson counter. To permit a change in the divisor only upon the completion of an output cycle, the second gating means is a bistable device which reads an incoming control signal only when the output of the Johnson counter makes a specified change in state. Advantageously, the switched frequency divider may be used as an FSK modulator to generate different AC frequencies from a single AC input signal in response to a digital data signal that is applied to said divider as said control signal.

BRIEF DESCRIPTION OF THE INVENTION

These and other objects, features and advantages of my invention will be more readily apparent from the following detailed description of the best mode for carrying out the invention in which:

FIG. 1 is a schematic diagram depicting an illustrative embodiment of a switched frequency divider of my invention; and FIGS. 2A-2H are waveforms useful in understanding the operation of the switched frequency divider of FIG. 1.

BEST MODE FOR CARRYING OUT THE INVENTION

As shown in FIG. 1, an illustrative embodiment of a switched frequency divider 10 of my invention comprises exclusive OR (XOR) gates 12, 14, 16, flip/flops 20, 22, 24, 26, 28, NAND gates 32, 34, 36, 38, and a NOR gate 42. As will be detailed below, divider 10 divides an input frequency $f_{in}$ by either 5 or 7 depending on whether the signal applied to XOR gate 16 is high or low. For purposes of frequency shift keying, the signal applied to XOR gate 16 is, of course, the data signal. The input signal $f_{in}$ is applied as one input to XOR gate 12. The output signal $f_{out}$ is produced at the Q terminal of flip/flop 26. Illustratively, the data signal is obtained from driver 150 of the modem apparatus shown in FIG. 2 of the above referenced application "Wide Band Modem for High Speed Data Transmission"; and the input signal comes from 17.5 MHz oscillator 110 via gate 115. In such example, the Q output of flip/flop 26 is applied to low pass filter 125.

XOR gate 14, NAND gate 32 and flip/flops 20, 22, 24, 26 comprise a Johnson counter in which the $\overline{Q}$ output of the last (or output) flip/flop is connected to the input of the first (or input) flip/flop and the Q outputs of each of the other flip-flops is connected to the input of the next succeeding flip-flop in the counter. Flip/flop 28, NAND gates 36 and 38 and NOR gate 42 constitute a switch 30 which switches flip/flop 20 into the counter if the input frequency is to be divided by 7 and switches it out of the counter if the input is to be divided by 5. Each of flip/flops 20–28 is a D type flip/flop which will transfer the signal at its D input to its Q output only upon a low-to-high transition of a signal applied to its clock input CK.

The operation of the circuit is best described in conjunction with the waveforms of FIGS. 2A–2H. The input signal is inverted by XOR gate 12 since the second input to this gate is high. For convenience, the inverted input signal is shown in FIG. 2A as a square wave but it will be recognized that its shape can be more sinusoidal. For discussion, it will be assumed that the Q output of flip/flop 26 has just gone low as shown in FIG. 2E. Under these circumstances, the Q outputs of flip-flops 20, 22 24 of the Johnson counter will also be low as shown in FIGS. 2B, 2C, and 2D. Further, it will be assumed that the Q output of flip/flop 28 is high with the result that the D input to flip/flop 22 is the same as the Q output of flip/flop 20. Since the Q output of flip/flop 24 is low and the Q̄ of flip/flop 26 shown in FIG. 2F is high, the output of NAND gate 32 as shown in FIG. 2G is high. As a result, XOR gate 14 operates to invert the input frequency signal once again, producing a signal shown in FIG. 2H.

Upon receipt of the next low-to-high transition in the signal from XOR gate 14 at the clock inputs of flip/flops 20–26, each flip/flop transfers the signal at its D input to its Q output. In the case of flip/flops 22, 24, 26 the input signals are all low so the output remains low. However, since the input to flip/flop 20 is high, the rising edge of the clock signal causes the Q output of flip/flop 20 to go high as shown in FIG. 2B. This signal is applied through NAND gate 36 and NOR gate 42 to the D input of flip/flop 22. Upon receipt of the next rising edge of the signal from XOR gate 14, flip/flops 20–26 again transfer the signal at their D input to their Q output. As a result, the Q output of flip/flop 22 shown in FIG. 2C now goes high.

The next rising edge of the signal from XOR gate 14 causes the Q output of flip/flop 24 shown in FIG. 2D to go high. Since both inputs to NAND gate 32 are now high, this causes the output of gate 32 shown in FIG. 2G to go low. As a result, after the signal propagates from the output of flip/flop 24 to the input to XOR gate 14, XOR gate 14 ceases to act as an inverter and the output of gate 14 accordingly goes low as shown in FIG. 2H.

The next low-to-high transition occurs within a half-cycle of the input signal. Upon receipt of this signal at flip/flop 26, the high signal at its input is transfered to its Q output and the Q̄ output of this flip/flop goes low. As a result, the output of NAND gate 32 again goes high and XOR gate 14 is again caused to operate as an inverter. This causes the output of XOR gate 14 to go low once again as shown in FIG. 2H.

Upon receipt of the next rising edge in the signal from XOR gate 14, the low signal on the Q̄ output of flip/flop 26 is transfered to the Q output of flip/flop 20. The next three rising edges in the signal from XOR gate 14 cause the low output to propagate through flip/flops 22, 24, 26 at the end of which time the output of flip/flop 26 is once again low and a full cycle of the output signal has been generated.

As will be apparent from the waveform of FIG. 2E which depicts the output of flip/flop 26, the output signal has a frequency which is one-seventh that of the input signal. Moreover the high and low states of the output waveform are of substantially equal duration so that the waveform has approximately a 50 percent duty cycle.

Division by 5 is an analogous process in which switch 30 operates so as to remove flip/flop 20 from the divider circuit. As a result, the duration of both the low output and high output of flip/flop 26 is one input cycle shorter and there is one output cycle for every five input cycles.

The operation of switch 30 will be evident. XOR gate 16 acts as an inverter. When a low signal is applied to gate 16, a high signal is produced at the D input of flip/flop 28. This signal is not utilized until a low-to-high transistion is received at the clock input CK. Upon receipt of such a signal, the high signal at the input of flip/flop 28 is transferred to its Q output. Because the Q̄ output is low, the output of NAND gate 38 is high and this branch of the circuit has no effect on the output of NOR gate 42. In contrast, the output of NAND gate 36 is the inversion of the Q output of flip/flop 20 and the output of NOR gate 42 is another inversion of this output. As a result, when the Q output of flip/flop 28 is high, the Q output of flip/flop 20 is applied to the D input of flip/flop 22. This has the effect of dividing the input frequency by seven.

When the input signal to XOR gate 16 is high, its output is low. Upon receipt of a low-to-high transistion at the clock input, the low signal is transferred to the Q output of flip/flop 28. As a result, the roles of NAND gates 36 and 38 are reversed. The signal from the Q output of flip/flop 20 has no effect on the output of NOR gate 42; and the signal from the Q output of flip/flop 26 is applied to the D output of flip/flop 22. This causes the divider to divide by five.

NAND gate 34 is a protection circuit which ensures that the Q output of flip/flop 24 is low when the Q outputs of flip/flops 22 and 26 are low. This permits the device to correct itself if by chance an output of one of the flip/flops 20–26 were to vary from the wave forms shown in FIGS. 2B–2E.

As will be apparent to those skilled in the art, my invention may be practiced in many forms. The Johnson counter can be implemented in other types of bistable devices than the D type flip/flops shown in FIG. 1. The number of stages used to provide division can be varied to suit one's need. Apparatus for performing division by any odd number N can be achieved by $(N+1)/2$ bistable devises connected as shown with NAND gate 32 or XOR gate 14 of FIG. 1. For division by an even number N, NAND gate 32 and XOR 14 are not used and the number of bistable devices required is $N/2$.

The particular elements of switch 30 are only illustrative. Other gating arrangements which achieve the same effect of switching one or more bistable devices in or out of the Johnson counter will be apparent to those skilled in the art from the above description. However, in order to ensure that the switching between one device and another only takes place upon completion of an output cycle, it is necessary that switch 30 be controlled from the output stage of the Johnson counter or from some surrogate therefor.

If it is desired, switch 30 can be expanded so as to provide for the division of the input AC frequency signal by any one of more than two divisors. The design of such an expanded switch as well as numerous other modifications will be apparent.

What is claimed is:

1. Apparatus for dividing the frequency of a signal comprising:
an array of clocked bistable devices which are linked together so as to propagate through the array a cycle of a high signal and a low signal applied to an input to the array, said array producing at an output from the array an output signal which goes through a cycle of a high signal and a low signal at a first frequency which is less than that of a clock signal applied to said bistable devices;
first gating means for inserting at least one more clocked bistable device into the array in response to a control signal applied to said apparatus, whereby the frequency of the output signal is changed to a second frequency,
second gating means for making such an insertion only when the output signal from the array completes one of said cycles, and means for imparting a duty cycle of approximately 50 percent to said output signal at both said first frequency and said second frequency.

2. The apparatus of claim 1 wherein the bistable devices of said array are coupled together in the form of a Johnson counter.

3. The apparatus of claim 1 wherein an inverted output of the last bistable device in the array is coupled to an input of the first bistable device in the array and the output of each bistable device except the last is coupled to an input of the next succeeding bistable device in the array.

4. The apparatus of claim 1 wherein the first gating means causes the array to contain a first number of bistable devices when a first control signal is applied to the apparatus and a different number of bistable devices when a second control signal is applied to the apparatus, whereby the frequency of the output signal is changed by said first and second control signals.

5. The apparatus of claim 1 wherein said second gating means comprises a bistable device which transfers a signal from a first input to an output only upon receipt of a specified signal transition at a second input and means for coupling an output of the last of the bistable devices in said array to said second input to provide said specified transition at said second input once for every output cycle.

6. A frequency shift key modulator comprising:
an oscillator,
an array of clocked bistable devices which are linked together so as to propagate through the array a cycle of a high signal and a low signal applied to an input to the array, said array producing at an output from the array an output signal which goes through a cycle of a high signal and a low signal at a first frequency which is less than that of a clock signal applied to said bistable devices from said oscillator,
first gating means for inserting at least one more clocked bistable device into the array in response to a digital data signal applied to said apparatus, whereby the frequency of the output signal is changed to a second frequency,
second gating means for making such an insertion only when the output signal from the array completes one of said cycles, and
means for imparting a duty cycle of approximately 50 percent to said output signal at both said first frequency and said second frequency.

7. The modulator of claim 6 wherein the bistable devices of said array are coupled together in the form of a Johnson counter.

* * * * *